United States Patent
Hosomi

(10) Patent No.: US 8,183,599 B2
(45) Date of Patent: *May 22, 2012

(54) SEMICONDUCTOR DEVICE WITH INTERFACE CIRCUIT AND METHOD OF CONFIGURING SEMICONDUCTOR DEVICES

(75) Inventor: Eiichi Hosomi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/024,615

(22) Filed: Feb. 10, 2011

(65) Prior Publication Data

US 2011/0133252 A1  Jun. 9, 2011

Related U.S. Application Data

(60) Continuation of application No. 12/642,614, filed on Dec. 18, 2009, now Pat. No. 7,910,956, which is a division of application No. 11/154,150, filed on Jun. 16, 2005, now abandoned.

(51) Int. Cl.
 *H01L 27/10* (2006.01)
(52) U.S. Cl. .................................................. 257/203
(58) Field of Classification Search .......... 257/202, 257/203–207, 786, 691, 370, 390, 443, 494, 257/495, 923, 925, 773, 784
See application file for complete search history.

(56) References Cited

U.S. PATENT DOCUMENTS

| | | | |
|---|---|---|---|
| 5,300,796 A * | 4/1994 | Shintani | ........................ 257/203 |
| 5,497,014 A | 3/1996 | Momose | |
| 5,742,079 A | 4/1998 | Doi | |
| 5,760,428 A | 6/1998 | Colwell et al. | |
| 5,780,881 A | 7/1998 | Matsuda et al. | |
| 6,066,866 A | 5/2000 | Omori | |
| 6,075,260 A | 6/2000 | Harayama | |
| 6,172,547 B1 | 1/2001 | Yokoyama | |
| 6,675,309 B1 | 1/2004 | Baxter | |
| 7,157,338 B2 | 1/2007 | Zommer et al. | |

(Continued)

FOREIGN PATENT DOCUMENTS

JP  4-163963  6/1992

OTHER PUBLICATIONS

Nakayama, Keizo, "Complete Study of ASIC Devise Structure", *Design Wave Magazine* (Japanese), Nov. 2003, pp. 46-54.

(Continued)

*Primary Examiner* — Dao H Nguyen
*Assistant Examiner* — Tram H Nguyen
(74) *Attorney, Agent, or Firm* — Sprinkle IP Law Group

(57) ABSTRACT

Methods and devices yielding an improved semiconductor device with interface circuit are disclosed. Configuring a semiconductor with parallel device features reduces process variation (e.g., lithographically-induced process variation or other defects). Embodiments of the present invention provide semiconductor devices with I/O cell device features (e.g., I/O gates or core gates) laid out in parallel. Additionally, embodiments of the present invention can allow patterning devices to be made to more exacting tolerances because some patterning devices may have a higher capability along one axis than another. Embodiments of the present invention also include a semiconductor device having like-functioned I/O cells arranged such that their layouts and rotational orientations with respect to their corresponding core remain constant. Furthermore, disclosed semiconductor devices may include at least one circuit cell having non-parallel features, where the circuit cell is arranged either within the core or within a corresponding interface circuit cell.

19 Claims, 5 Drawing Sheets

U.S. PATENT DOCUMENTS

| | | | |
|---|---|---|---|
| 7,910,956 B2* | 3/2011 | Hosomi | 257/203 |
| 2002/0056857 A1 | 5/2002 | Iwasa | |
| 2004/0241915 A1 | 12/2004 | Shoji et al. | |

OTHER PUBLICATIONS

Office Action for U.S. Appl. No. 11/154,150, mailed Aug. 27, 2007, 13 pgs.

Office Action for U.S. Appl. No. 11/154,150, mailed Feb. 25, 2008, 18 pgs.

Office Action for U.S. Appl. No. 11/154,150, mailed Oct. 22, 2008, 19 pgs.

Office Action for U.S. Appl. No. 11/154,150, mailed, Mar. 9, 2009, 15 pgs.

Office Action for U.S. Appl. No. 11/154,150, mailed, Jul. 7, 2009, 15 pgs.

Office Action for U.S. Appl. No. 12/642,614, mailed Aug. 19, 2010, 12 pgs.

Notice of Allowance for U.S. Appl. No. 12/642,614, mailed Nov. 16, 2010, 8 pgs.

* cited by examiner

SEMICONDUCTOR DEVICE WITH INTERFACE CIRCUIT AND METHOD OF CONFIGURING SEMICONDUCTOR DEVICES

CROSS-REFERENCE TO RELATED APPLICATION

This application is a continuation of, and claims a benefit of priority under 35 U.S.C. 120 of the filing date of U.S. patent application Ser. No. 12/642,614 by inventors Eiichi Hosomi entitled "Semiconductor Device with Interface Circuit and Method of Configuring Semiconductor Devices" filed on Dec. 18, 2009, which is a divisional of, and claims a benefit of priority under 35 U.S.C. 120 of the filing date of U.S. patent application Ser. No. 11/154,150 by inventors Eiichi Hosomi entitled "Semiconductor Device with Interface Circuit and Method of Configuring Semiconductor Devices" filed on Jun. 16, 2005, the entire contents of which are hereby expressly incorporated by reference for all purposes.

TECHNICAL FIELD OF THE INVENTION

The invention relates in general to methods and devices for semiconductors. More specifically, it relates to configuration of semiconductor devices having Input/Output (I/O) interface circuits.

BACKGROUND OF THE INVENTION

The demand for faster and smaller microelectronic devices is driving continual shrinks of microelectronic architectures. Such microelectronic architectures form the electronic circuits of semiconductor devices. Semiconductor devices are manufactured on silicon wafers using a process of adding layers and selectively removing parts of the layers. The wafers are cut into individual dies upon the completion of the manufacturing process. Each individual die includes a semiconductor device having a core area, where logical computations are made.

Individual dies are not typically directly integrated into electronic devices, such as, for example, cell phones. Thus, semiconductor devices typically include at least one I/O (input/output) interface circuit enabling communication with other devices. I/O circuits, or cells, are typically arranged at the periphery of each individual die. This peripheral area may be referred to as the I/O ring.

In the manufacture of semiconductor devices, the selective removal of layers is enabled by a process called lithography. Through lithography, ever smaller features are imaged on the wafer surface. Increasingly smaller gate transistors are required to satisfy the increasingly higher speed requirements of microelectronic devices. However, as just one example, factors such as the wavelength of light place limitations on minimum resolvable feature sizes. Further, semiconductor devices and their I/O rings are becoming more complex due to their increasing compaction of functionality. Consequently, improvements to lithographic processes are continually sought to enable production of continually shrinking features. It follows that it is desirable to reduce semiconductor processing variation. Therefore, a need exists for improved methods for semiconductor devices, improved semiconductor devices, and improved lithographic patterning devices.

SUMMARY OF THE INVENTION

Methods and devices yielding improved semiconductor devices are disclosed. In particular, process-induced variation is reduced by arranging critically-dimensioned features in parallel.

Accordingly, a method of configuring a semiconductor device is disclosed having a uniform I/O cell layout, and/or a majority of core area device features and/or I/O cell device features arranged in parallel. In an embodiment, the features may be critically-dimensioned. Such parallel arrangement reduces process-induced variation, not only during the fabrication of the semiconductor device, but also during the manufacture of the patterning device used to fabricate the semiconductor device. Thus, embodiments of the invention having parallel device feature (e.g., gate) layout can significantly reduce yield loss for the semiconductor device.

Consequently, also disclosed is a patterning device which may be used to produce parallel semiconductor features. Such a patterning device may be configured for use with any of a variety of semiconductor patterning systems.

Also disclosed is a method of configuring a semiconductor device which may have a majority of features on at least one processing layer arranged substantially in parallel. In the embodiment, I/O cells performing like functions may be arranged either horizontally or vertically while maintaining similar orientations and feature layouts. For example, horizontal I/O cells are not rotated with respect to vertical I/O cells. Such I/O cell configuration may utilize space typically unused in prior art semiconductor device configurations. Thus, the improved I/O cell configuration may allow increased device complexity and may also provide increased signal density.

In an embodiment, a circuit cell having randomly-arranged device features may be arranged within the semiconductor device. Such a circuit cell may be arranged within the core or within a corresponding I/O cell.

These, and other, aspects of the invention will be better appreciated and understood when considered in conjunction with the following description and the accompanying drawings. The following description, while indicating various embodiments of the invention and numerous specific details thereof, is given by way of illustration and not of limitation. Many substitutions, modifications, additions or rearrangements may be made within the scope of the invention, and the invention includes all such substitutions, modifications, additions or rearrangements.

BRIEF DESCRIPTION OF THE DRAWINGS

The drawings accompanying and forming part of this specification are included to depict certain aspects of the invention. A clearer impression of the invention, and of the components and operation of systems provided with the invention, will become more readily apparent by referring to the exemplary, and therefore nonlimiting, embodiments illustrated in the drawings, wherein identical reference numerals designate the same components. Note that the features illustrated in the drawings are not necessarily drawn to scale.

DETAILED DESCRIPTION

The invention and the various features and advantageous details thereof are explained more fully with reference to the nonlimiting embodiments that are illustrated in the accompanying drawings and detailed in the following description. Descriptions of well known starting materials, processing techniques, components and equipment are omitted so as not to unnecessarily obscure the invention in detail. It should be understood, however, that the detailed description and the specific examples, while indicating preferred embodiments of the invention, are given by way of illustration only and not by way of limitation. After reading the specification, various substitutions, modifications, additions and rearrangements will become apparent to those skilled in the art from this disclosure which do not depart from the scope of the appended claims.

Embodiments of the present invention provide semiconductors with device features (e.g., I/O gates or core gates) laid out in parallel. Configuring a semiconductor with parallel device features reduces process variation (e.g., lithographically-induced process variation or other defects). Additionally, embodiments of the present invention can allow patterning devices to be made to more exacting tolerances because some patterning devices may have a higher capability along one axis than another.

Device features are those features on a semiconductor device which are functional and which may be required for device functionality. A semiconductor device may have elements that are inoperable, such as alpha-numerics indicating device ID and/or layer ID, as well as alignment and/or registration verniers. These inoperable elements are not generally considered device features. A semiconductor integrated circuit device according to the present invention can have a common layer in which the core and the I/O cell both reside and such common layer can be a conductive layer or a polysilicon layer.

Device features are usually created one process layer at a time. For example, the polysilicon layer, from which transistor gates are typically formed. Some of the device features arranged at these layers may be commonly referred to as 'critically-dimensioned.' Critically-dimensioned features may have dimensions at or near the capability of technologies to manufacture a particular microprocessor. Manufacture of critically-dimensioned device features is facilitated by a low level of defectivity and a low level of process-induced variation.

Figure 1:
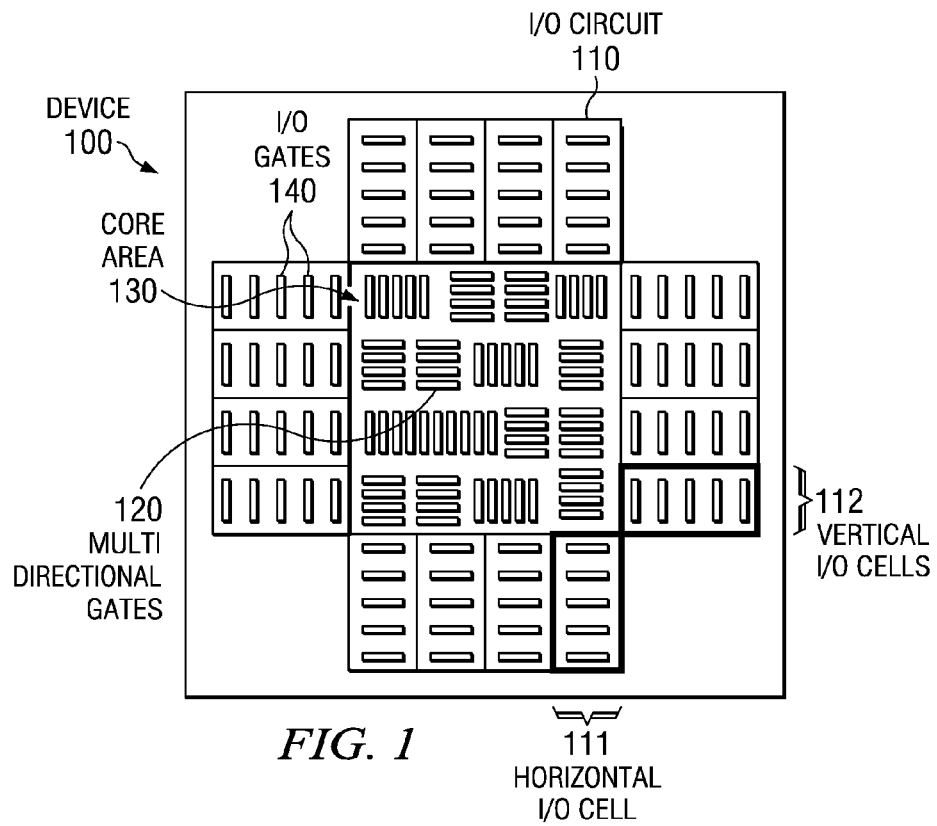
FIG. 1 depicts a semiconductor device having a core area with multi-directional gates and uniform I/O cells with multi-directional gates.

FIG. 1 depicts a semiconductor device 100 having a uniform I/O cell layout and a uniform cell footprint, but with multi-directional gates within the uniform I/O cells. As used herein, the term I/O cell footprint (or simply "footprint") refers to the size and shape of the overall I/O cell (e.g., the I/O cell boundary) and the term I/O cell layout (or simply "layout") refers to the positioning and/or size and/or shape of the features (e.g., gates) within the I/O cell. Semiconductor device 100 has a core area 130 with multi-directional gates 120 and I/O cells 110 with multi-directional gates 140. Multi-directional gates may include gates that are both substantially horizontal and substantially vertical with respect to an x-axis through core area 130. As shown in FIG. 1, I/O circuit cell 110 has a rectangular shape or rectangular footprint. As shown, such rectangular I/O cells 110 are arranged such that a shorter edge of the rectangular I/O cell 110 is parallel to an edge of core area 130. For simplicity, I/O cells 110 are shown having substantially similar layouts of I/O gates 140. I/O cells having similar layouts typically perform similar functions. Although FIG. 1 shows a device 100 having only one type of I/O cell 110, it is understood that there may be many different types of I/O cells, each performing a different, specific function. Further, it is understood that each device described in this specification may have many different types of I/O cells.

As shown in FIG. 1, the same I/O cell 110 for a particular function is used around the periphery of core area 130. That is, horizontally arranged I/O cells 111 for a particular function have substantially matching layouts as vertically arranged I/O cells 112 for the same function. For example, assuming the two cells perform the same function, the layout of horizontally arranged cell 111 becomes the layout for vertically arranged cell 112 by rotating the horizontal cell layout 90 degrees counter-clockwise. Like-functioned circuit cells arranged along the top and bottom edges of core area 130 are symmetric about an x axis through the center of core area 130. Similarly, like-functioned circuit cells arranged along the right and left edges of core area 130 are symmetric about a y axis through the center of core area 130.

Figure 2:
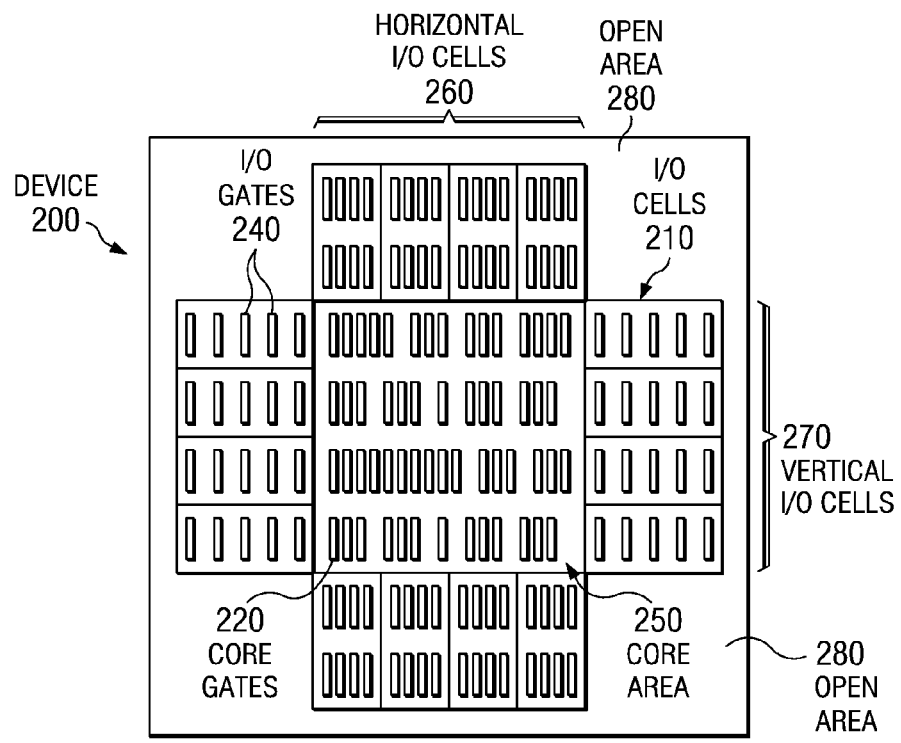
FIG. 2 depicts one embodiment of a semiconductor device having a core area with unidirectional, or parallel, gates and I/O cells with parallel gates.

FIG. 2 depicts one embodiment of a semiconductor device 200 according to the present invention having uniform gate direction throughout the device, but uses two I/O cell layouts. Semiconductor device 200 has a core area 250 with parallel core gates 220 and I/O cells 210 with parallel I/O gates 240. While shown with all or substantially all parallel gates, some embodiments could have at least 90% of the gates in parallel or even less than 90% of gates in parallel. It should be understood that while in FIGS. 2-9, the device features (e.g., gates) are shown where all or a substantial portion of the gates are substantially parallel within the core areas and I/O cells, alternative embodiments can include arrangement of the features (e.g., gates) such that at least 90% of the gate are parallel, or even in some embodiments, less than 90% of the gates are arranged substantially parallel to one another.

For example, in an alternative embodiment for FIG. 2, at least 90% of core gates 220 can be arranged parallel to one another and at least 90% of I/O gates 240 can be arranged parallel to one another. In yet another alternative embodiment, less than 90% of I/O cell gates and/or core gates can be arranged parallel to each other. In addition, the core gates 220 may be arranged substantially parallel to I/O gates 240 (as shown in FIG. 2). In another embodiment, core gates 220 and/or I/O gates 240 may be critically-dimensioned.

In an alternate embodiment, all or substantially all core gates 220 are arranged in parallel to one another throughout core 250 of semiconductor device 200, and all or substantially all of I/O gates 240 are arranged in parallel to one another. Further, as shown in the embodiment of FIG. 2, core gates 220 that are parallel to one another may be arranged in parallel to I/O gates 240 that are parallel to one another. In another embodiment, core gates 220 and/or I/O gates 240 may be critically-dimensioned.

In some embodiments, one or more of I/O gates 240 and/or one or more of core gates 220 may be arranged such that they are not parallel to the parallel I/O gates 240 and/or the parallel core gates 220. In one embodiment, such non-parallel gates will be relatively isolated or otherwise distanced from the parallel gates. Also, such non-parallel gates may not be critically-dimensioned, (e.g., may be comparatively larger in size than the parallel gates in device 200.) In one embodiment, gates which may be properly characterized as non-critically-dimensioned can have minimum dimensions that are approximately 25-35% (or more) larger than the minimum dimensions of critically-dimensioned gates.

Device features, such as gates, that are substantially parallel may be arranged in parallel with the greatest accuracy possible. However, the terms parallel or substantially parallel will be used interchangeably. Furthermore, although the specification may utilize gates in describing embodiments of the present invention, it is understood that features other than gates may also benefit from the described configurations.

Referring again to FIG. 2, the same I/O cell footprint is used for each I/O cell 210 around the periphery of the core 250. As shown in the embodiment of FIG. 2, vertical I/O cells 270 and horizontal I/O cells 260 each have a short edge adjacent the core area 250, effectively leaving unused several open areas 280. Horizontal I/O cell 260 and vertical I/O cell 270 have respective footprints that are rotationally disposed one from another. Consequently, for a particular function, it is difficult to use the same I/O cell gate layout horizontally and vertically while maintaining parallel gates within each I/O cell as well as among all I/O cells. As discussed, layouts can include both the features and their positions within the cell perimeter defined by the footprint. Therefore, for the embodiment of FIG. 2, it is desirable to design for each function two different I/O cell layouts, where horizontal I/O cells 260 have a layout which varies from that of vertical I/O cells 270, as shown.

Figure 3:
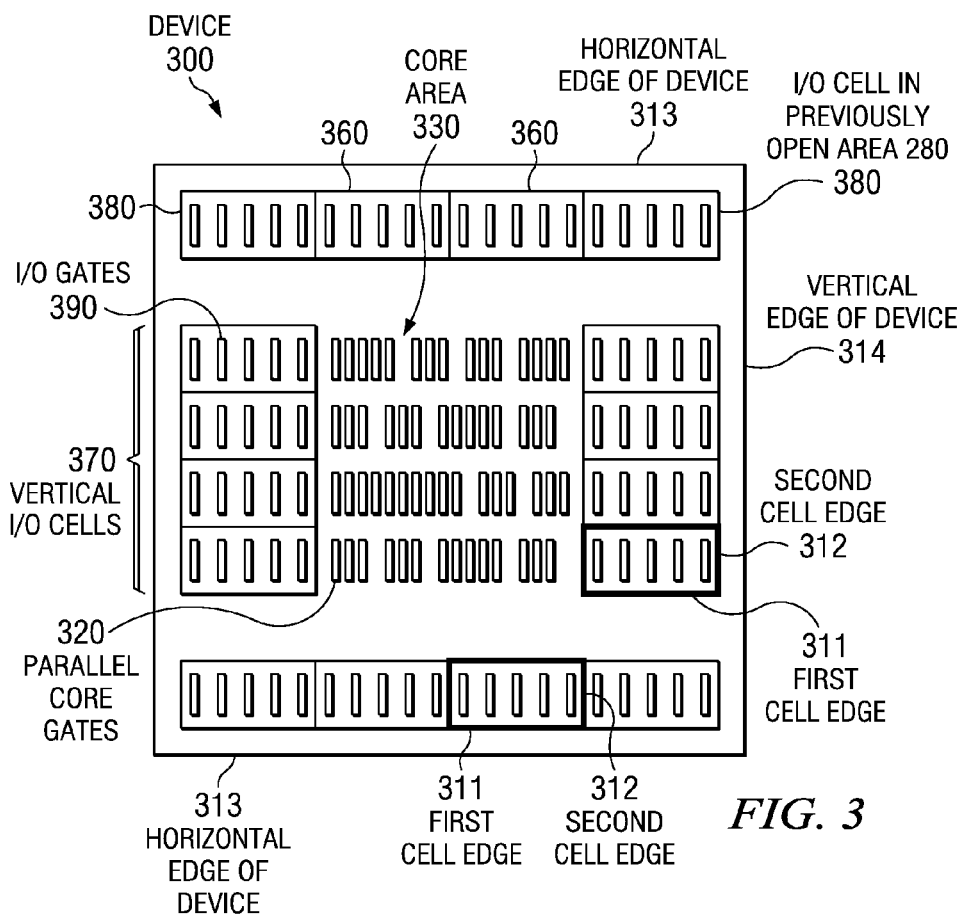
FIG. 3 depicts one embodiment of a semiconductor device having a core area with parallel gates and uniform I/O cells with parallel gates, where the horizontal I/O cells have layouts similar to those of the vertical I/O cells.

FIG. 3 depicts one embodiment of a semiconductor device 300 according to the invention having uniform I/O cell layouts throughout the device and substantially parallel gates throughout the device. As shown, core area 330 with parallel core gates 320. In this embodiment, the same I/O cell layout for a particular function can be used for an I/O cell regardless of I/O cell location. Thus, for a particular function, horizontal I/O cells 360 are substantially identical in layout and footprint to vertical I/O cells 370. Further, horizontal I/O cells 360 and vertical I/O cells 370 have like orientations. That is, horizontal I/O cells 360 are translationally, but not rotationally, disposed from vertical I/O cells 370. Therefore, I/O gates 390 are arranged substantially in parallel throughout semiconductor device 300. Consequently, gates may be arranged substantially in parallel throughout at least a majority of, if not substantially all of, semiconductor device 300. Additionally, as described above in reference to FIG. 2, core gates 320 and/or I/O gates 390 may be arranged in various configurations having substantially parallel gates.

In one embodiment, I/O cell gates 390 are critically-dimensioned and arranged in parallel. As shown, I/O cell gates 390 may be parallel to core gates 320. However, at least one I/O gate 390 may be arranged perpendicularly or otherwise not parallel to a majority of core gates 320. Such non-parallel gate may be isolated or offset from either I/O gates 390 within the I/O cell, or core gates 320 arranged adjacent the I/O cell.

As noted, the horizontal I/O cells 360 are substantially identical to the vertical I/O cells 370. Thus, horizontal I/O cells 360 have a cell size which is substantially the same as the cell size of the vertical I/O cells 370. Furthermore, the orientation of the horizontal I/O cells 360 is substantially the same as the orientation of the vertical I/O cells 370. That is, the horizontal I/O cells 360 are arranged like the vertical I/O cells 370 in that the shorter edges of all I/O cells are substantially parallel to one another.

In the embodiment shown in FIG. 3, first cell edge 311 is shorter than second cell edge 312. Each I/O cell has a first cell edge 311 arranged perpendicular to a second cell edge 312. A first cell edge 311 of one I/O cell corresponds to a first cell edge 311 of any other I/O cell, and a second cell edge 312 of one I/O cell corresponds to a second cell edge 312 of any other I/O cell.

Horizontal I/O cell 360 is arranged along horizontal edge 313 of device 300 such that first cell edge 311 is parallel to horizontal edge 313. Similarly, vertical I/O cell 370 is arranged along vertical edge 314 of device 300 such that second cell edge 312 is parallel to vertical edge 314. Such an I/O cell layout more fully populates the device 300, allowing utilization of previously unused areas.

For example, depicted in FIG. 2 are open areas 280. Open areas 280 are located in the corners of device 200. As shown in FIG. 3, I/O cells 380 occupy such previously unused areas. In addition to more fully utilizing available area, I/O cells as described by FIG. 3 may yield other advantages, as described below in reference to FIG. 4.

Figure 4:
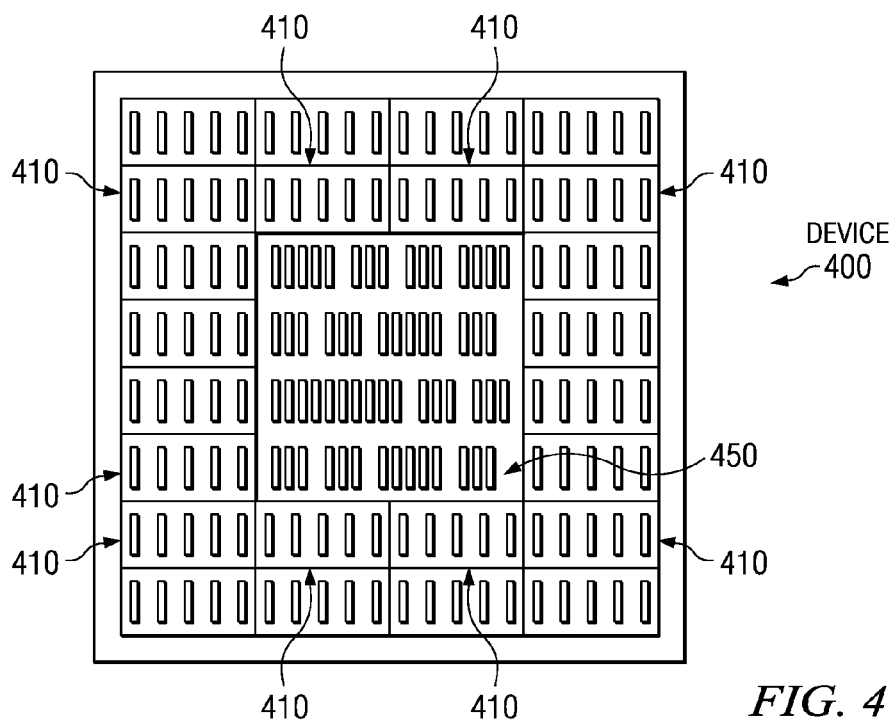
FIG. 4 depicts one embodiment of a semiconductor device having a core area with parallel gates and uniform I/O cells with parallel gates, where the horizontal I/O cells have layouts similar to those of the vertical I/O cells, where the I/O cells are arranged to have a substantially fully populated I/O cell layout.

FIG. 4 is one embodiment of semiconductor device 400 according to the invention having a fully populated layout of similarly-oriented I/O cells 410 overlaying the area outside the core area 450, in which the I/O cells 410 have a uniform cell layout and substantially all of the gates in device 400 are arranged in parallel. Similarly-oriented means substantially all short I/O cell edges are arranged parallel to one another and substantially all long I/O cell edges are arranged parallel to one another as shown in FIG. 4. Such a layout includes additional I/O cells 410 as compared to the embodiment of FIG. 3. As described above in reference to FIGS. 2 and 3, core device features (e.g., gates) and I/O device features (e.g., gates) may be arranged in various configurations such that all or substantially all the device features are substantially parallel to one another. As discussed previously, in an alternative embodiment, at least 90% of all device features of semiconductor device 400 can be arranged to be substantially parallel, while in yet another embodiment, there may less than 90% of all device features of semiconductor device 400 arranged in parallel.

As compared to FIG. 3, the I/O cell layouts of FIG. 4 allows for additional I/O cells 410 arranged across the top and bottom edges of the die and/or core. Such a configuration may increase signal density of the semiconductor device. Additional I/O cells 410 may also allow additional functionality to be realized from the semiconductor device. In one embodiment, the additional I/O cells 410 allow a variety of routing options and/or packaging options.

Figure 5:
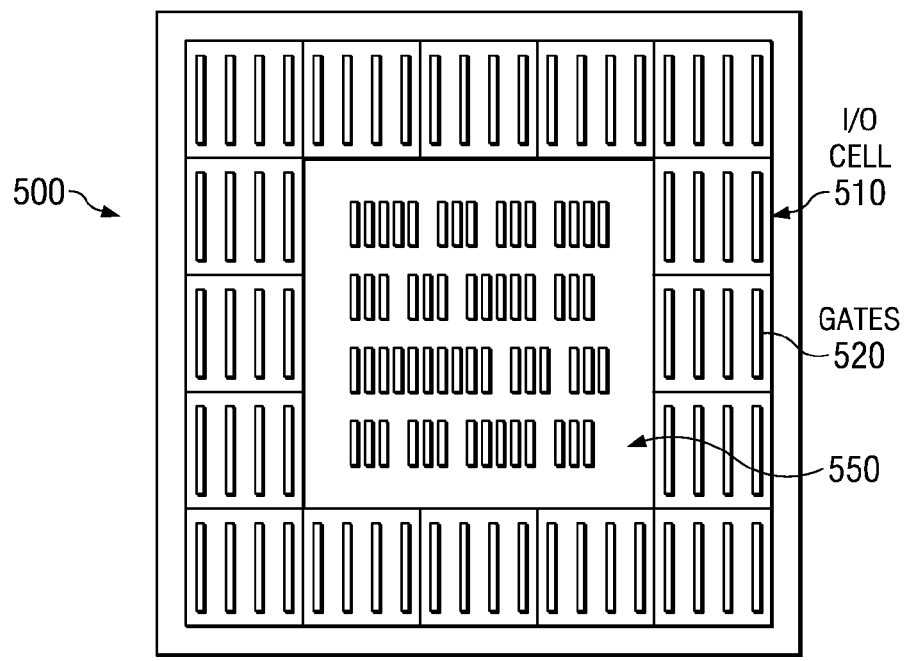
FIG. 5 depicts one embodiment of a semiconductor device having a core area with parallel gates and uniform I/O cells with parallel gates, where the horizontal I/O cells are similar to the vertical I/O cells and where the I/O cells are square.

FIG. 5 depicts one embodiment of a semiconductor device according to the invention having a core area 550 with parallel gates and uniform I/O cells 510 (e.g., parallel gates, where the horizontal I/O cells 510 substantially match the vertical I/O cells 510), and where all I/O cells 510 have a substantially square footprint. Similar to embodiments previously discussed, I/O cells 510 having similar functionality are used in the x and y direction, and such I/O cells 510 have matching layouts. As described above in reference to FIGS. 2-4, core device features (e.g., gates) and I/O device features (e.g., gates) may be arranged in various configurations, including for example, where a majority of device features are substantially parallel.

As noted above, aligning in parallel critically-dimensioned features may be useful in reducing process variation. For example, in the case of gate width variation among critically-dimensioned gates arranged within arrays. However, some circuits within the semiconductor device, such as analog circuits, may have wider gates. Thus, some gate widths may not be critically-dimensioned and such gate widths may not necessarily benefit from parallel arrangement.

Figure 6:
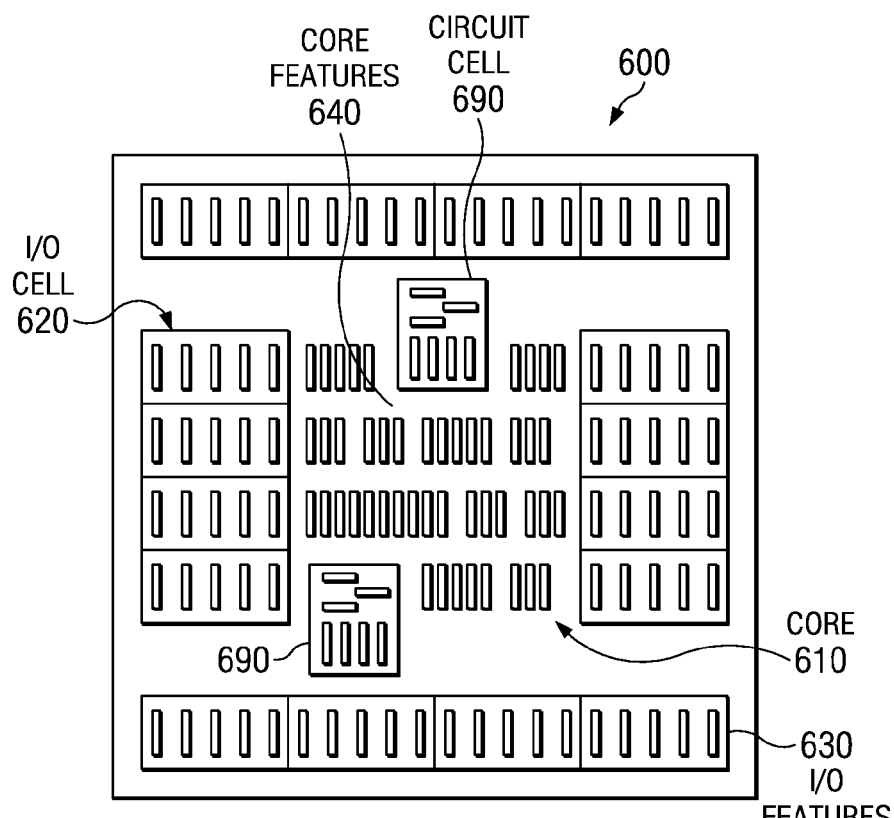
FIG. 6 depicts one embodiment of a semiconductor device having a core area and uniform I/O cells, where the core area includes circuit cells.

FIG. 6 depicts one embodiment of a semiconductor device 600 according to the invention having layout uniform I/O cells 620 with gates parallel to a majority of the gates in core area 610 of device 600. As shown, semiconductor device 600 includes core area 610 and I/O cells 620, where the core area 610 includes circuit cells 690. As described above in reference to other FIGURES, core features 640 and I/O features 630 may be arranged in various configurations, including for example, where a majority of device features are substantially parallel.

In the embodiment of FIG. 6, core area 610 has a majority of parallel features (e.g., gates), except for some features (e.g., gates) in circuit cells 690, which are not parallel. In circuit cell 690, gate width variation may not be critical to the performance or yield of the semiconductor device 600. As an example, circuit cell 690 may contain analog circuits, which have relatively wide gates or relatively long gates. Consequently, gate orientation in circuit cells 690 may be arbitrary. As shown, circuit cell 690 has gates oriented both horizontally and vertically. In this embodiment, circuit cell 690 may have no critically-dimensioned features. For example, the features of circuit cell 690 may be at least 25-35% larger than any of the critically dimensioned features of device 600.

Figure 7:
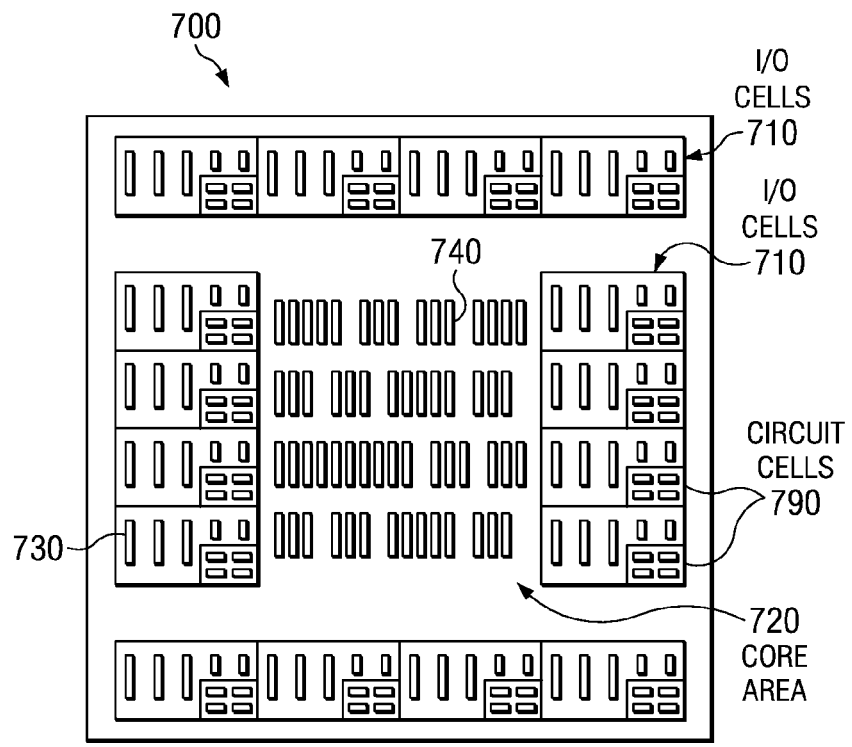
FIG. 7 depicts one embodiment of a semiconductor device having a core area and uniform I/O cells, where the I/O cells include circuit cells and where the I/O cells are substantially matching and translationally disposed.
Figure 8:
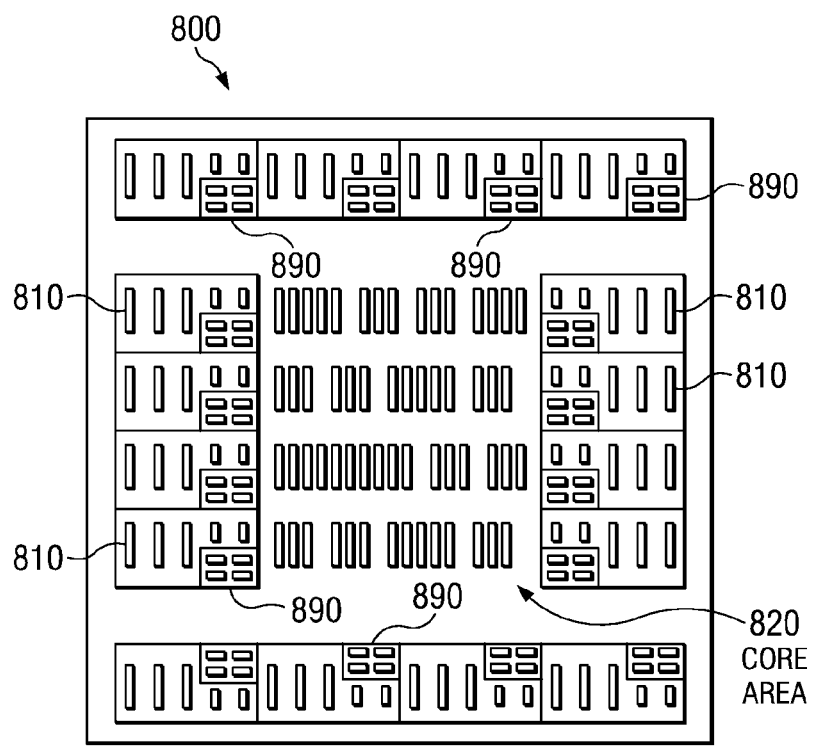
FIG. 8 depicts one embodiment of a semiconductor device having a core area and uniform I/O cells, where the I/O cells include circuit cells and where the I/O cells are reflexively matching.
Figure 9:
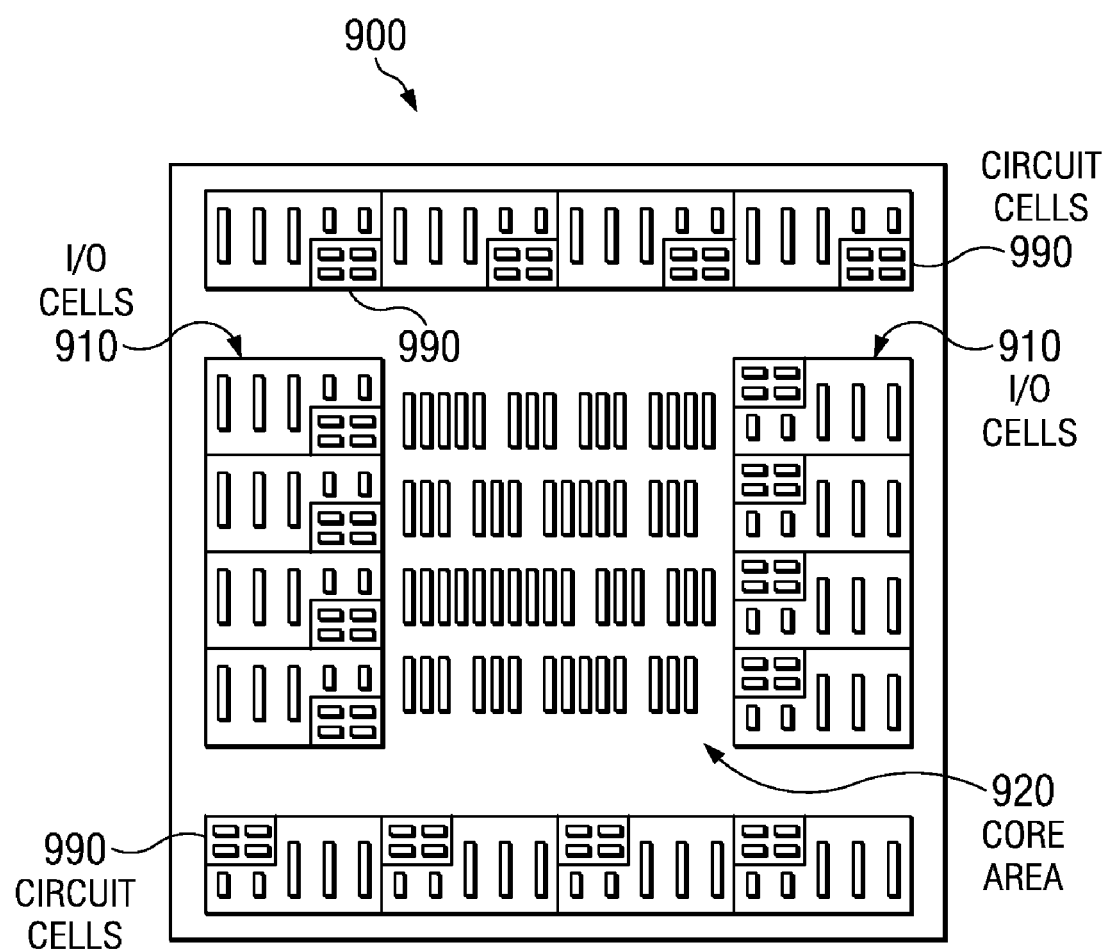
FIG. 9 depicts one embodiment of a semiconductor device having a core area and uniform I/O cells, where the I/O cells include circuit cells and where the I/O cells are in point symmetry.

As shown in FIGS. 7-9, circuit cells can also be arranged within I/O cells. The circuit cells may be arranged in a number of configurations. Further, the circuit cells may have comparatively large features, for example long gate transistors (or conversely, wide gate transistors (not shown)). Consequently, circuit cells may have features which are not arranged in parallel. As described above in reference to other FIGURES, core device features and I/O device features may be arranged in various configurations where a majority of device features are substantially parallel.

FIG. 7 depicts one embodiment of semiconductor device 700 according to the present invention with uniform I/O cells 710, but where such I/O cells 710 include circuit cells 790 that can have gates that are not parallel to the other gates in semiconductor device 700 (as shown). Semiconductor device 700 has a core area 720 and I/O cells 710 where each I/O cell 710 includes a circuit cell 790. Circuit cells 790 may have at least one non-critically dimensioned feature, whereas, the remaining features in I/O cell 710 may be critically dimensioned. Further, there may be a number of different circuit cells 790 in I/O cells 710, each having a particular function. As shown in FIG. 7, I/O cells 710 are substantially uniform. That is, I/O cells 710 have substantially the same I/O cell footprint and layout including placement of circuit cell 790 within I/O cell 710. As shown, I/O cells 710 are translationally disposed from each other. Furthermore, as shown in FIG. 7, the non-circuit cell gates 730 are all arranged in parallel to each other, and are arranged in parallel to core area gates 790. In an alternative embodiment, substantially all core gates 790 can be parallel to one another, and in yet another alternative embodiment at least 90% of all core gates can be parallel to one another. It should be understood that various percentages of gates within I/O cells and cores of semiconductor devices can be parallel come within the scope of this invention.

FIG. 8 depicts one embodiment of a semiconductor device 800 having a core area 820 and uniform I/O cells 810 that include circuit cells 890. I/O cells 810, including placement of circuit cells 890, are arranged in a substantially reflexively matching manner. That is, the horizontally and vertically arranged same-function I/O cells 810 with circuit cells 890 are symmetric about x and y axes, respectively. Thus, they may be described as reflexively matching. However, in one embodiment, circuit cells 890 may not necessarily be symmetric. Features within the respective circuit cells 890 are not necessarily reflexively matching.

FIG. 9 depicts one embodiment of a semiconductor device 900 having core area 920 and uniform I/O cells 910 that include circuit cells 990, where and I/O cells 910 are in point symmetry. In the embodiment, semiconductor device 900 has circuit cells 990 arranged within each I/O cell 910. I/O cells 910 are in point symmetry from top to bottom and from side to side. That is, the top row I/O cell layouts, including placement of circuit cell 990, are rotated 180 degrees from the bottom row I/O cell layouts, including placement of circuit cell 990. The left and right columns of I/O cell layouts, including placement of circuit cell 990, are similarly rotated with respect to one another. Thus, in this embodiment, I/O cells 910 are in point symmetry.

As described above, lithographic images are created through the use of patterning devices. Each patterning device typically contains pattern images for a single processing layer. Pattern images are comprised of individual features, such as the individual features shown in FIGS. 1 through 9. Consequently, FIGS. 1 through 9 may also be representative of corresponding patterning devices instead of merely resultant semiconductor devices. Further, patterning devices may be used with any one of a variety of lithographic systems including, but not limited to, contact, g-line, i-line, duv, euv, x-ray, and imprint systems. As such, patterning devices may be any one of a variety of devices including, but not limited to, photomasks, reticles, and imprint templates. Furthermore, such a patterning device may not be limited solely to the manufacture of semiconductor devices.

In the foregoing specification, the invention has been described with reference to specific embodiments. For example, any time a Figure illustrates a uniform I/O cell with uniform feature layout and the same footprint, it should be understood that the footprint can vary from I/O cell to I/O cell (e.g., wider) without departing from the scope of the invention. One of ordinary skill in the art appreciates that various additional modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any component(s) that may cause any benefit, advantage, or solution to occur or become more pronounced are not to be construed as a critical, required, or essential feature or component of any or all the claims.

The invention claimed is:

1. A semiconductor integrated circuit device, comprising:
a core area; and
a plurality of I/O cells surrounding the core area, wherein each of the I/O cell comprises a plurality of I/O cell device features, wherein at least 90% of the I/O cell device features are substantially parallel to one another, wherein the core area comprises a plurality of core device features, wherein at least 90% of the core device features are substantially parallel to one another, and wherein at least 90% of the I/O cell device features are substantially parallel to at least 90% of the core device features.

2. The device claim 1, wherein the I/O cell device features and the core device features comprise gates.

3. The device of claim 1, wherein the plurality of I/O cells further comprise a plurality of horizontal I/O cells and a plurality of vertical I/O cells, wherein the plurality of horizontal I/O cells and the plurality of vertical I/O cells have dissimilar layouts.

4. The device of claim 1, wherein the plurality of I/O cells further comprise a plurality of horizontal I/O cells and a plurality of vertical I/O cells, wherein the plurality of horizontal I/O cells and the plurality of vertical I/O cells have substantially matching device feature layouts.

5. The device of claim 1, wherein the I/O cells have a substantially square footprint.

6. The device of claim 1, further comprising at least one circuit cell, wherein the at least one circuit cell comprises circuit cell device features, and wherein the at least one circuit cell is arranged within the core area or within at least one I/O cell.

7. The device of claim 6, wherein the circuit cell device features comprise at least one feature arranged perpendicular to the core device features or to the I/O cell device features.

8. The device of claim 2, wherein the plurality of I/O cells further comprise a plurality of horizontal I/O cells and a plurality of vertical I/O cells, and wherein the plurality of horizontal I/O cells are translationally disposed with respect to the plurality of vertical I/O cells.

9. The device of claim 2, wherein the plurality of I/O cells further comprise a plurality of horizontal I/O cells and a plurality of vertical I/O cells, and wherein the horizontal I/O cell and the vertical I/O cell are symmetrically disposed.

10. A semiconductor integrated circuit device, comprising:
a core area; and
a plurality of I/O cells surrounding the core area, wherein each of the I/O cells comprises a plurality of I/O cell device features, wherein at least 90% of all the I/O cell device features are substantially parallel to one another.

11. The device of claim 10, wherein the core area comprises a plurality of core device features, wherein at least 90% of the core device features are substantially parallel to one another, and wherein at least 90% of the I/O cell device features are substantially parallel to at least 90% of the core device features.

12. The device claim 11, wherein the I/O cell device features and the core device features comprise gates.

13. The device of claim 11, wherein the plurality of I/O cells further comprise a plurality of horizontal I/O cells and a plurality of vertical I/O cells, wherein the plurality of horizontal I/O cells and the plurality of vertical I/O cells have dissimilar layouts.

14. The device of claim 11, wherein the plurality of I/O cells further comprise a plurality of horizontal I/O cells and a plurality of vertical I/O cells, wherein the plurality of horizontal I/O cells and the plurality of vertical I/O cells have substantially matching device feature layouts.

15. The device of claim 11, wherein the I/O cells have a substantially square footprint.

16. The device of claim 11, further comprising at least one circuit cell, wherein the at least one circuit cell comprises circuit cell device features, and wherein the at least one circuit cell is arranged within the core area or within at least one I/O cell.

17. The device of claim 16, wherein the circuit cell device features comprise at least one feature arranged perpendicular to the core device features or to the I/O cell device features.

18. The device of claim 12, wherein the plurality of I/O cells further comprise a plurality of horizontal I/O cells and a plurality of vertical I/O cells, and wherein the plurality of horizontal I/O cells are translationally disposed with respect to the plurality of vertical I/O cells.

19. The device of claim 12, wherein the plurality of I/O cells further comprise a plurality of horizontal I/O cells and a plurality of vertical I/O cells, and wherein the horizontal I/O cell and the vertical I/O cell are symmetrically disposed.

* * * * *